United States Patent
Ikeda et al.

(10) Patent No.: US 7,798,389 B2
(45) Date of Patent: *Sep. 21, 2010

(54) FLUX FOR SOLDERING, SOLDERING METHOD, AND PRINTED CIRCUIT BOARD

(75) Inventors: Kazuki Ikeda, Kakogawa (JP); Hisao Irie, Kakogawa (JP); Toshinori Shima, Kakogawa (JP); Takaaki Anada, Kakogawa (JP); Syunsuke Ishikawa, Kakogawa (JP)

(73) Assignee: Harima Chemicals, Inc., Hyogo (JP)

( * ) Notice: Subject to any disclaimer, the term of this patent is extended or adjusted under 35 U.S.C. 154(b) by 537 days.

This patent is subject to a terminal disclaimer.

(21) Appl. No.: 11/727,014

(22) Filed: Mar. 23, 2007

(65) Prior Publication Data

US 2007/0186997 A1   Aug. 16, 2007

Related U.S. Application Data

(62) Division of application No. 10/924,867, filed on Aug. 25, 2004, now abandoned.

(51) Int. Cl.
*B23K 31/02* (2006.01)
*B23K 35/36* (2006.01)

(52) U.S. Cl. .................. 228/224; 148/23
(58) Field of Classification Search .......... 228/224; 148/23

See application file for complete search history.

(56) References Cited

U.S. PATENT DOCUMENTS

| 5,127,968 A | 7/1992 | Gomi et al. |
| 2004/0079194 A1* | 4/2004 | Nakata et al. .......... 75/255 |

FOREIGN PATENT DOCUMENTS

| CN | 85 02604 A | 12/1985 |
| JP | 62-016899 | 1/1987 |
| JP | 6-264284 | 9/1994 |
| JP | 07-163794 | 5/1995 |
| JP | 07155985 A | 6/1995 |
| JP | 10-163404 | 6/1998 |
| JP | 11254184 | 9/1999 |
| JP | 11254184 A | 9/1999 |
| JP | 2000/200963 | 7/2000 |
| JP | 2003236695 | 8/2003 |

OTHER PUBLICATIONS

Chinese Office Action dated Aug. 22, 2008.

* cited by examiner

*Primary Examiner*—Roy King
*Assistant Examiner*—Weiping Zhu
(74) *Attorney, Agent, or Firm*—Sughrue Mion, PLLC

(57) ABSTRACT

A flux for soldering used when soldering is performed to a board subjected to electroless nickel plating, the flux containing resin having film forming ability, activator, and solvent, and further containing metallic salt in an amount of 0.1 to 20% by weight of the total amount of flux. The use of this flux suppresses diffusion of nickel solder in soldering portions, and prevents concentration of phosphorous, thereby improving the bonding strength of soldering.

11 Claims, No Drawings

FLUX FOR SOLDERING, SOLDERING METHOD, AND PRINTED CIRCUIT BOARD

CROSS-REFERENCE TO RELATED APPLICATION

This application is a Divisional of U.S. application Ser. No. 10/924,867, filed Aug. 25, 2004, abandoned Jun. 26, 2007; the disclosure of which is incorporated herein by reference.

BACKGROUND OF THE INVENTION

1. Field of the Invention

The present invention relates to a flux for soldering used when soldering various electronic components on a printed circuit board, and more particularly to a flux used when soldering is performed onto copper lands of a printed circuit board subjected to electro less nickel plating, as well as a soldering method and a printed circuit board.

2. Description of Related Art

When electronic component s are soldered onto a printed circuit board, soldering onto copper lands formed on the printed circuit board has conventionally been performed with the use of tin/lead alloy solder or lead-free solder. In order to prevent oxidation of copper, electro less nickel plating is often applied to the surfaces of the lands.

However, when electro less nickel plating is applied to the lands, a trace quantity of phosphorous compound remains in a nickel plating layer because hypophosphite is used as reducing agent.

Therefore, during soldering with the use of solder alloy to the surface of electro less nickel plating, the nickel in the nickel plating diffuses into the melted solder alloy, and phosphorus segregates locally at the boundaries between the nickel plating layer and the solder alloy. This causes extremely concentrated portions of phosphorous, and hence bonding strength is lowered thereby to strip soldering in some cases.

Japanese Unexamined Patent Publication No. 6-264284 discloses a method of forming a wiring board including: forming electro less nickel/boron plating film on a wiring pattern composed of tungsten or molybdenum and on a connecting pad which are formed on a ceramic printed wiring board; performing heat treatment; and forming a nickel/phosphorous plating film. In this method, the drop in bonding strength, due to concentration of phosphorus in connecting interface during soldering and brazing of gold/tin, etc., is prevented by setting phosphorus content at not more than 6%, and a plating film at 0.3 to 2 µm.

Japanese Unexamined Patent Publication No. 10-163404 discloses an input/output terminal for BGA formed by attaching, instead of conventional solder balls, Cu balls whose surface is coated with a solder plating layer, to a Cu pad whose surface is coated with an electro less Au plating layer via a P-containing electro less Ni plating layer.

These methods require additional processing such as two-stage plating operation and ball processing. Additionally, the use of specific board and balls lowers versatility, at which the present invention aims from the point of view of performing general solder connection on a general board.

SUMMARY OF THE INVENTION

One advantage of the present invention is to provide a flux having improvements in bonding strength by suppressing nickel from diffusing into melted solder alloy during soldering, and preventing concentration of phosphorous, as well as a soldering method using the flux, and a printed circuit board.

Other advantage of the present invention is to provide a flux having improvements in preservation stability, a soldering method using the flux, and a printed circuit board.

In addition, the above-mentioned problems can be solved simply at low cost, because there is no need to use specially prepared board and solder balls.

A flux for soldering of the present invention, which is used when soldering is performed onto a board subjected to electro less nickel plating, contains resin having film forming ability, activator, and solvent, and further contains metallic salt, particularly, metallic salt of organic acid, in an amount of 0.1 to 20% by weight of the total amount of flux.

The metallic salt suppresses the nickel in the lands surfaces from diffusing into solder alloy, and prevents phosphorous from concentrating in the boundaries between the lands and the solder. This enables to improve the bonding strength of the solder. Additionally, the use of the flux of the present invention results in good solder ability, and the application of the present invention causes no lowering of solder ability.

The reason why the diffusion of nickel into the solder alloy is suppressed in the present invention is not clear. However, it is presumed that the metal in the metallic salt of organic acid in the flux deposits due to replacement by nickel, and this suppresses the reaction of nickel and the metal in the solder alloy, thereby suppressing the nickel in the lands surfaces from diffusing into the solder alloy.

Preferably, in the present invention, the metallic salt is metallic salt of organic acid, and the activator is organic acid that is the same as organic acid composing the metallic salt of organic acid, or organic acid having a lower acidity than that. In particular, the flux of the present invention preferably does not contain halogen compound such as hydrochloric acid.

By so doing, even if the flux is preserved for a long period of time, it is able to prevent metallic salt from being decomposed, thereby improving the stability of the metallic salt. Specifically, it is able to suppress a great drop in the bonding strength of solder and in the insulation resistance between the lands. Lowering of insulation resistance is liable to occur in, for example, a soldering method in which a flux is printed overall on a board having lands, and solder balls are mounted on the lands and allowed to reflow, thereby connecting solder balls to the lands. Further, the drop in the stability of metallic salt can result in insufficient reforming effect of bonding strength by the addition of metallic salt.

A first soldering method of the present invention is characterized by printing the above-mentioned flux for soldering on a board having on its surface copper lands subjected to electro less nickel plating; mounting solder balls on the lands; and heating to have the solder balls reflow and connect to the lands. Preferably, solder balls to be used are lead-free from the point of view of environmental impact.

A second soldering method of the present invention is characterized by printing paste that is a mixture of the above-mentioned flux for soldering and solder powder, on a board having on its surface copper lands subjected to electro less nickel plating; and heating to have the paste reflow so as to form solder alloy on the lands.

The present invention also intends to provide a printed circuit board in which solder is connected by the soldering method as above described.

Meanwhile, a board is also used generally which is obtained by applying electro less nickel plating to a board, and further applying plating of other metal such as gold, in consideration of solderwettability. In the present invention, the concept of "a board subjected to electro less nickel plating" includes a board having plating of other metal, such as gold, on nickel plating.

Other objects and advantages of the present invention will be apparent from the following detailed description.

DETAILED DESCRIPTION OF THE PREFERRED EMBODIMENTS

A flux for soldering of the present invention contains resin having film forming ability, activator, metallic salt, and solvent. As resin having film forming ability, there are, for example, rosin and thermoplastic acrylic resin.

Acrylic resin has a molecular weight of not more than 10000, preferably 3000 to 8000. When the molecular weight exceeds 10000, cracking resistance and debonding resistance may drop. In order to aid active action, acid value is preferably not less than 50. Softening point is preferably 230° C. or below, because it is necessary that acrylic resin is softened during soldering.

Therefore, examples of suitable acrylic resin are composed from monomers having polymerizing unsaturated group, such as (metha) acrylic acid and ester thereof (e.g., methyl (metha) acrylate, etc.), crotonic acid, itaconic acid, maleic anhydride and ester thereof, (metha) acrylonitrile, (metha) acrylamide, vinyl chloride, and vinyl acetate. These are preferably polymerized with the use of catalyst, such as peroxide, by radical polymerization such as bulk polymerization method, solution polymerization method, suspension polymerization method, and emulsion polymerization method.

As rosin, rosins conventionally used in fluxes, and derivatives thereof are usable. As rosin and derivative thereof, general gum, tall, and wood rosin are usable. Examples of the derivative thereof are heat treated resin, polymerized rosin, hydrogenated rosin, formylated rosin, rosin ester, rosin modified maleic resin, rosin modified phenol resin, and rosin modified alkyd resin.

The content of resin having film forming ability is in an amount of 20 to 80% by weight, preferably, 30 to 65% by weight of the total amount of flux. When the content is less than 20% by weight, wettability may deteriorate. On the other hand, when the content is over 80% by weight, viscosity control is impossible and hence operability may deteriorate.

As metal composition of metallic salt added to the flux of the present invention, there are, for example, gold, silver, copper, lead, zinc, bismuth, indium, antimony, and nickel. Especially, copper is preferred. As acid composition, there are used organic acids such as various fatty acids, and resin acids; and inorganic acids such as hydrogen halide, nitric acid, and sulfuric acid. Specifically, lead stearate, bismuth octylate, copper naphthenate, indium acetate, silver nitrate, and zinc chloride are usable. In the present invention, it is preferable to use organic acid such as various fatty acids and resin acids, as acid composition. Specifically, it is preferable to use organic acid such as saturated fatty acids and resin acids whose alkyl portion has a carbon number of usually about 7 to 21, such as stearic acid, octyl acid, naphthenic acid, and rosin acid (including diterpene acid such as abietic acid and pimaric acid contained as main component of rosin).

The content of metallic salt is in an amount of 0.1 to 20% by weight of the total amount of flux. When the content is less than 0.1% by weight, it is difficult to suppress the nickel in the land surfaces from diffusing into solder alloy, and hence it is impossible to improve the bonding strength of solder. On the other hand, when the content is over 20% by weight, insulation resistance may drop.

When metallic salt is metallic salt of organic acid, activator is preferably organic acid that is the same as organic acid composing the metallic salt of organic acid, or organic acid having a lower acidity than that. Usually, acidity can be evaluated by the acidity constant (electrolytic dissociation constant) Ka value and pKa value ($-\log Ka$) of solution. In general, acidity tends to decrease as the carbon number of organic acid increases. Therefore, organic acid of low acidity means organic acid having a greater carbon number than organic acid composing metallic salt of organic acid. For example, with respect to copper octylate, organic acid having a greater carbon number than that, such as stearic acid, may be used as activator. The above-mentioned rosin containing rosin acid is suitably usable as organic acid of low acidity.

If organic acid having a higher acidity than organic acid composition metallic salt of organic acid is used as activator, the acid may decompose the metallic salt of organic acid, and hence such organic acid is unsuitable. Examples of suitable combinations of metallic salt of organic acid and activator (organic acid) are copper stearate and stearic acid; and copper stearate and rosin.

The content of activator is in amount of 0.1 to 30% by weight of the total amount of flux. When the content is less than 0.1% by weight, the function of activator, namely, the active power for removing and cleaning metallic oxide on the metal surface is insufficient, so that solder ability may be lowered. On the other hand, when the content is over 30% by weight, the film forming ability of flux decreases and hydrophilicity increases, so that corrosivity and insulation ability may be lowered. In the case of using rosin so as to perform both functions of resin and activator, the contents of rosin and derivative thereof must be in an amount, within which both functions of these are not impaired.

As solvent, there are, for example, alcohol solvents such as ethyl alcohol, isopropyl alcohol, ethyl Cellosolve, butyl carbitol, and hexyl carbitol (diethylene glycol monohexyl ether); and ester solvents such as ethyl acetate and butyl acetate; and hydrocarbon solvents such as toluene and turpentine oil.

The content of solvent is in an amount of 5 to 70% by weight of the total amount of flux. When organic solvent is less than 5% by weight, the viscosity of flux increases, and the application ability of flux might deteriorate. On the other hand, when organic solvent is over 70% by weight, the ratio of effective compositions (e.g., resin) as flux is reduced, so that solder ability may be lowered.

The flux of the present invention can be manufactured by mixing the respective compositions as above described, and then melting while heating. The flux of the present invention may contain other compositions such as thixotropy agent, in addition to the above-mentioned compositions. As thixotropy agent, there are, for example, hydrogenated castor oil (hardened castor oil), beeswax, carnauba wax, amide stearate, ethylenebisamide hydroxystearate. The content of thixotropy agent is preferably in an amount of 1.0 to 25% by weight of the total amount of flux.

Additionally, the flux of the present invention may be used together with synthetic resin such as polyester resin, phenoxy resin, and terpene resin, which have been known and used as base resin of flux. It is also able to add additives such as antioxidant, fungicide, and delustering agent.

The flux of the present invention is used in cases where electro less nickel plating is already applied to the lands of a board. Although no limitations are imposed on the metal of the lands to which electro less nickel plating is applied, but copper is preferred.

Although no limitations are also imposed on the type of solder alloy used for soldering, general tin/lead alloy solder is usable. Alternatively, there may be used so-called lead-free solder in which metal such as silver, zinc, bismuth, indium, and antimony is mixed with tin that is used as base.

In a soldering method of the present invention, the above-mentioned flux for soldering is printed by screen printing on a board having on its surface copper lands to which electro less nickel plating is already applied; and solder balls are mounted on the lands and heated to have the solder balls reflow and connect onto the lands. Solder balls are preferably composed of lead-free solder, as above described, from the point of view of environmental impact. The reflow of solder balls is performed after printing by, for example, preheating at 150 to 200° C. and heating at 170 to 250° C. or directly heating without preheating. Printing and reflow may be carried out in the atmosphere of air, or in the atmosphere of an inert gas such as nitrogen, argon, and helium.

In the present invention, paste that is a mixture of the above-mentioned flux for soldering and solder power may be printed on a board having on its surface copper lands subjected to electro less nickel plating, followed by heating to have the paste reflow so as to form solder alloy on the lands.

Examples of the present invention will be described below. It is understood, however, that the examples are for the purpose of illustration and the invention is not to be regarded as limited to any of the specific materials or condition therein.

EXAMPLES

Experimental Example 1

Lands having a diameter of 0.8 mm, in which electro less nickel plating was applied to copper, were formed on a board, and the following fluxes were printed individually in a thickness of 200 μm on the board, and solder balls of Sn-37Pb having a diameter of 0.8 mm were mounted on the lands, followed by heating to have the solder balls reflow.
  Flux 1: RA flux (chlorine content: 0.2%) (blank);
  Flux 2: 5 wt % of lead stearate was added to Flux 1; and
  Flux 3: 3 wt % of copper naphthenate was added to Flux 1.
The compositions of the RA flux is as follows:

| | |
|---|---|
| WW class tall rosin | 70 parts by weight |
| Hexyl carbitol | 25 parts by weight |
| Hydrogenated castor oil | 4.5 parts by weight |
| Ethylamine HCl | 0.5 parts by weight |

Experimental Example 2

Lands having a diameter of 0.8 mm, in which electro less nickel plating was applied to copper, were formed on a board, and the following fluxes were printed individually in a thickness of 200 μm on the board, and solder balls of Sn-3.5Ag having a diameter of 0.8 mm were mounted on the lands, followed by heating to have the solder balls reflow.
  Flux 4: Water soluble flux (chlorine content: 2%) (blank);
  Flux 5: 2 wt % of lead stearate and 3 wt % of copper naphthenate were added to Flux 4; and
  Flux 6: 3 wt % of bismuth octylate was added to Flux 4.
The compositions of the water soluble flux is as follows:

| | |
|---|---|
| Polyamine resin | 60 parts by weight |
| Rosin EO addition product | 35 parts by weight |
| Ethylamine HCl | 5 parts by weight |

Experimental Example 3

Lands having a diameter of 0.8 mm, in which electro less nickel plating was applied to copper, were formed on a board, and paste prepared by mixing 10 wt % of each of the following fluxes and 90 wt % of solder powder of Sn-37Pb (mean particle diameter: 20 to 40 μm) was printed individually in a thickness of 200 μm on the board, followed by heating to have the solder powder reflow.
  Flux 7: RA flux (chlorine content: 0.2%) (blank);
  Flux 8: 5 wt % of lead stearate was added to Flux 7; and
  Flux 9: 3 wt % of copper naphthenate was added to Flux 7
The used RA flux was the same as that used in Experimental Example 1.

[Evaluation Method]

1. Distribution States of Nickel and Phosphorous

In regard to the boards soldered in the above respective experimental examples, the distribution states of nickel and phosphorous in the soldered portions were observed with an X ray microanalyzer, in order to examine the presence or absence of nickel diffusion, and the presence or absence of concentration of phosphorous.

2. Bonding Strength

In regard to the soldered portions of the boards soldered in the above respective experimental examples, tension test was carried out to measure bonding strength. Ones whose mean strength was improved by not less than 10% than the blanks of Fluxes 1, 4, and 7 were judged as being effective in improving bonding strength.

3. Solder ability

With a microscope at x20 magnification, the soldered portions of the boards soldered by the above respective experimental examples were observed to examine the wetting state of solder to the boards.

The results of the above respective tests are shown in Table 1.

TABLE 1

| Flux | Solder | Diffusion of Ni | Concentration of P | Bonding Strength (N) | Solderability |
|---|---|---|---|---|---|
| 1 | Sn—37Pb | presence | presence | 14.2 | good |
| 2 | Solderball | absence | absence | 16.0 | good |
| 3 | | absence | absence | 16.8 | good |
| 4 | Sn—3.5Ag | presence | presence | 12.9 | good |
| 5 | Solderball | absence | absence | 14.8 | good |
| 6 | | absence | absence | 15.5 | good |
| 7 | Sn—37Pb | presence | presence | 13.2 | good |
| 8 | Paste | absence | absence | 16.4 | good |
| 9 | | absence | absence | 17.1 | good |

Subsequently, the following tests were conducted in order to confirm the influence exerted on solder ability and preservation stability by the combination of metallic salt added for improving the bonding strength of soldering, and activator used together with the metallic salt.

Examples 1 to 8, and Comparative Examples 1 to 7

[Selection of metallic salt and activator]

The following materials were selected as metallic salt:
  A: $(C_{17}H_{35}COO)_2Cu$
  B: $(C_7H_{15}COO)_2Cu$ C: $(C_{21}H_{43}COO)_2Cu$
D: $(C_{17}H_{35}COO)_2Pb$ The following materials were selected as activator:
E: $C_7H_{15}COOH$
F: $C_{17}H_{35}COOH$
G: $C_{21}H_{43}COOH$
H: $(CH_3)_2CHNH_2 \cdot HCl$ Here, the strength of acidity can be expressed as follows: H>E>F>G.

[Preparation of Rosin Flux (RF)]

| WW class tall rosin | 70 parts by weight |
| Hexyl carbitol | 25 parts by weight |
| Hydrogenated castor oil | 5 parts by weight |

Based on the above prescription, the respective materials were mixed, and this was melted while heating to 120° C., then cooled to room temperature, thereby preparing a viscous flux. [Preparation of Acryl Flux (AF)]

| Acryl resin (Paraloid B-48N, manufacture by Rohm and Haas Company) | 50 parts by weight |
| Hexyl carbitol | 45 parts by weight |
| Hydrogenated castor oil | 5 parts by weight |

Based on the above prescription, the respective materials were mixed, and this was melted while heating to 120° C., then cooled to room temperature, thereby preparing a viscous flux.

[Preparation of Copper Salt and Activator Mixed Flux]

The previously selected metallic salt and activator, and the base flux so prepared (the above-mentioned RF or AF) were mixed, and this was melted while heating to 100° C., then cooled to room temperature. The types and mixing ratios (% by weight) of the used base fluxes, metallic salts, and activators are shown in Table 2.

TABLE 2

Unit: wt.

| | Base Fluxes | | Metallic Salt | | Activator | |
| --- | --- | --- | --- | --- | --- | --- |
| | Type | Mixing Ratio (wt.) | Type | Mixing ratio (wt %) | Type | Mixing Ratio (wt.) |
| Example 1 | RF | 90 | A | 10 | — | — |
| Example 2 | RF | 88 | A | 10 | F | 2 |
| Example 3 | RF | 88 | A | 10 | G | 2 |
| Example 4 | RF | 88 | B | 10 | E | 2 |
| Example 5 | RF | 88 | C | 10 | G | 2 |
| Example 6 | RF | 88 | D | 10 | F | 2 |
| Example 7 | AF | 88 | A | 10 | F | 2 |
| Example 8 | AF | 88 | A | 10 | G | 2 |
| Comparative Example 1 | RF | 100 | — | — | — | — |
| Comparative Example 2 | RF | 88 | A | 10 | E | 2 |
| Comparative Example 3 | RF | 88 | A | 10 | H | 2 |
| Comparative Example 4 | RF | 88 | C | 10 | F | 2 |
| Comparative Example 5 | AF | 90 | A | 10 | — | — |
| Comparative Example 6 | AF | 88 | A | 10 | E | 2 |
| Comparative Example 7 | AF | 88 | A | 10 | H | 2 |

[Evaluation Method]

1. Measurement of Insulation Resistance

On a board in which lands were disposed in a tandem pattern, the flux obtained in each of Examples and Comparative Examples was printed overall on the board in a thickness of 100 μm, followed by reflow at a maximum temperature of 250° C. The fluxes used in the measurement of insulation resistance were of two types, namely, the flux immediate after manufacturing, and the flux left for one month at 40° C. After reflow, based on the test method of JIS Z 3197, the board was left for 1000 hours at a temperature of 85° C. in an atmosphere having a relative humidity of 85%, while applying a voltage of DC5OV to the board. Then, the insulation resistance between the lands was measured.

2. Measurement of Bonding strength

Electro less nickel plating was applied to copper lands on a board, and gold plating was further applied thereto, thereby forming lands having a diameter of 0.4 mm. On the board, the flux of each of Examples and Comparative Examples (immediately after manufacturing) was printed in solid state in a thickness of 100 μm.

Then, on the lands, Sn-35Ag-0.5Cu solder balls were mounted and allowed to reflow and connect onto the lands. Subsequently, this board was immersed in and cleaned with an ultrasonic washer filled with butylcarbitol solution of 60° C., in order to remove the flux.

Next, with a DAGE-SERIES-4000P, manufactured by DAGE Incorporation, the bonding strength of the solder balls was measured (heated bump pull strength). The measurement was made at 30 points, respectively, and its mean value was employed as bonding strength, and its minimum value as minimum bonding strength.

3. Wettability Evaluation On a copper plate subjected to oxidation at 150° C. for one hour, 0.025 g of each flux (immediately after manufacturing) of Examples and Comparative Examples in Table 1 was mounted, and Sn—Pb solder balls having a diameter of 1 mm were mounted thereon, followed by heating with a hot plate of 230° C. for one minute. Thereafter, the height of the solder was measured, and the wetting and spreading rate was calculated from the following equation. Wetting and spreading rate is to evaluate the active power of activator, and a higher wetting and spreading rate indicates a higher active power of activator.

Wetting and Spreading Rate=(1−Height of Solder)×100

The test results of these are shown in Table 3.

TABLE 3

|  | Insulation Resistance (Ω) | | Minimum | | |
|---|---|---|---|---|---|
|  | Flux immediate After manufacturing | Flux left for one month at 40° C. | Bonding Strength (N) | Bonding strength (N) | Wetting and Spreading Rate (%) |
| Example 1 | $1.8 \times 10^{12}$ | $1.5 \times 10^{12}$ | 18.5 | 15.5 | 78% |
| Example 2 | $2.0 \times 10^{12}$ | $1.8 \times 10^{12}$ | 19.0 | 14.8 | 87% |
| Example 3 | $1.5 \times 10^{12}$ | $1.7 \times 10^{12}$ | 18.0 | 16.0 | 85% |
| Example 4 | $1.2 \times 10^{12}$ | $1.0 \times 10^{12}$ | 17.8 | 14.0 | 84% |
| Example 5 | $1.4 \times 10^{12}$ | $1.5 \times 10^{12}$ | 18.3 | 14.7 | 81% |
| Example 6 | $1.7 \times 10^{12}$ | $1.5 \times 10^{12}$ | 18.6 | 15.8 | 86% |
| Example 7 | $1.5 \times 10^{12}$ | $1.8 \times 10^{12}$ | 18.2 | 14.3 | 82% |
| Example 8 | $1.8 \times 10^{12}$ | $1.3 \times 10^{12}$ | 17.9 | 15.0 | 83% |
| Comparative Example 1 | $3.0 \times 10^{12}$ | $2.0 \times 10^{12}$ | 15.1 | 6.3 | 76% |
| Comparative Example 2 | $1.8 \times 10^{11}$ | $<1 \times 10^{7}$ | 17.0 | 13.9 | 85% |
| Comparative Example 3 | $1.5 \times 10^{10}$ | $<1 \times 10^{7}$ | 16.8 | 14.2 | 87% |
| Comparative Example 4 | $2.0 \times 10^{11}$ | $<1 \times 10^{7}$ | 17.8 | 14.5 | 82% |
| Comparative Example 5 | $2.0 \times 10^{12}$ | $1.8 \times 10^{12}$ | 16.5 | 14.5 | 65% |
| Comparative Example 6 | $1.3 \times 10^{11}$ | $<1 \times 10^{7}$ | 17.2 | 14.0 | 80% |
| Comparative Example 7 | $1.2 \times 10^{10}$ | $<1 \times 10^{7}$ | 16.4 | 13.8 | 82% |

As shown in Table 3, the fluxes of Examples 1 to 8 do not decrease insulation resistance after being left at 40° C. for one month. To the contrary, in Comparative Examples 2, 3, 4, 6, and 7, the stability of metallic salt was poor, and the drop in insulation resistance was observed in use of the flux after being left at 40° C. for one month.

All of the fluxes of Examples 1 to 8 maintain a high bonding strength. Whereas in Comparative Example 1, the mean bonding strength was low because it does not contain metallic salt, and some points indicate an extremely low bonding strength. Comparative Example 5 indicates a low wetting and spreading rate due to a low active power.

What is claimed is:

1. A soldering method comprising the steps of:
   (A) printing a soldering flux comprising a resin having a film forming ability, an activator, and a solvent, and further comprising a metallic salt in an amount of 0.1 to 20% by weight of a total amount of flux, on a board having on its surface, copper lands subjected to electroless nickel plating;
   (B) mounting solder balls on said lands; and
   (C) heating said board so that said solder balls reflow and connect onto said lands.

2. The soldering method according to claim 1, wherein said solder balls are lead-free.

3. A soldering method comprising the steps of:
   (A) printing a paste that comprises a mixture of a soldering flux comprising a resin having a film forming ability, an activator, and a solvent, and further comprising a metallic salt in an amount of 0.1 to 20% by weight of a total amount of flux and a solder powder, on a board having on its surface, copper lands subjected to electroless nickel plating; and
   (B) heating said board so that said paste reflows and forms a solder alloy on said lands.

4. The soldering method according to claim 1 or 3, wherein said metallic salt is salt of a metal selected from the group consisting of gold, silver, copper, lead, zinc, bismuth, indium, antimony and nickel.

5. The soldering method according to claim 1 or 3, wherein said metallic salt is a metallic salt of an organic acid, and said activator is an organic acid that is same as the organic acid of said metallic salt of an organic acid, or is an organic acid having a lower acidity than the organic acid of said metallic salt of an organic acid.

6. The soldering method according to claim 4, wherein said metallic salt of an organic acid is a copper salt of an organic acid.

7. The soldering method according to claim 5, wherein said metallic salt of an organic acid is a metallic salt of a saturated fatty acid whose hydrocarbon group(s), other than that of the carboxyl group of said acid, has(have) a carbon number of 7 to 21.

8. The soldering method according to claim 5, wherein said activator is a rosin.

9. The soldering method according to claim 1 or 3, wherein said resin having a film forming ability is a rosin or acrylic resin.

10. The soldering method according to claim 1 or 3, wherein said resin having a film forming ability is a rosin, and said rosin also functions as said activator.

11. The soldering method according to claim 1 or 3, wherein said flux does not contain a halogen compound.

* * * * *